United States Patent
Chao et al.

(10) Patent No.: US 7,427,803 B2
(45) Date of Patent: Sep. 23, 2008

(54) ELECTROMAGNETIC SHIELDING USING THROUGH-SILICON VIAS

(75) Inventors: Clinton Chao, Hsin-Chu (TW); Chao-Shun Hsu, I-Land County (TW); Mark Shane Peng, Hsin-Chu (TW); Szu Wei Lu, Hsin-Chu (TW); Tjandra Winata Karta, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/525,603

(22) Filed: Sep. 22, 2006

(65) Prior Publication Data

US 2008/0073747 A1    Mar. 27, 2008

(51) Int. Cl.
*H01L 23/552* (2006.01)
*H01L 23/58* (2006.01)

(52) U.S. Cl. ............... 257/659; 257/660; 257/E23.002; 257/E23.145

(58) Field of Classification Search ............... 257/509, 257/660, E23.002, E23.145, 659
See application file for complete search history.

(56) References Cited

U.S. PATENT DOCUMENTS

| 5,202,754 | A | 4/1993 | Bertin et al. |
| 6,548,391 | B1 | 4/2003 | Ramm et al. |
| 2005/0282381 | A1* | 12/2005 | Cohen et al. ............ 438/637 |
| 2006/0229583 | A1* | 10/2006 | Wang et al. ............ 607/9 |

OTHER PUBLICATIONS

Su, David K., et al., "Experimental Results and Modeling Techniques for Substrate Noise in Mixed-Signal Integrated Circuits," IEEE Journal of Solid-State Circuits, vol. 28, No. 4, Apr. 1993, pp. 420-430.

* cited by examiner

*Primary Examiner*—Evan Pert
(74) *Attorney, Agent, or Firm*—Slater & Matsil, L.L.P.

(57) ABSTRACT

An isolation structure for electromagnetic interference includes a semiconductor substrate, a first integrated circuit in the semiconductor substrate, a second integrated circuit in the semiconductor substrate, and an isolation structure in a direct path between the first and the second integrated circuits, wherein the isolation structure comprises a through-silicon via.

18 Claims, 5 Drawing Sheets

ELECTROMAGNETIC SHIELDING USING THROUGH-SILICON VIAS

TECHNICAL FIELD

This invention relates generally to integrated circuits, and more particularly to the isolation of electromagnetic interference between integrated circuits.

BACKGROUND

Recent advances in IC design and fabrication make possible the integration of various types of integrated circuits, for example, digital and analog circuits on a same IC chip. The high degree of integration causes high noise coupling between the integrated circuits. Particularly, analog circuits are easily affected by the noise generated in digital circuits. This significantly limits the performance of analog circuits, such as analog to digital converters that are extremely sensitive to noise at the inputs. Besides the noise interference between digital circuits and analog circuits, noise interference also exists between digital circuit components. FIG. 1 illustrates a noise path between a digital circuit region 2 and an analog circuit region 3. Arrows 4, 5 and 6 symbolize one of the noise paths in substrate 1.

A significant portion of the noise coupling occurs in substrates. Therefore, various methods have been developed to break the noise paths in substrates. One commonly used method is to form isolation layers in the substrate. As is shown in FIG. 1, an isolation layer 7 is formed in semiconductor substrate 1, breaking the noise path between circuit regions 2 and 3. Isolation layer 7 is typically formed of dielectric materials. One example of isolation layer 7 is a deep trench isolation. To form a deep trench isolation, trenches with nearly vertical sides are etched between circuits and then filled with dielectric materials. However, even deep trench isolations are not satisfactory when full isolation between the circuits is required. This is particularly true when high-speed analog circuits are involved.

Another known method is the placement of guard rings in the substrates between the circuits to be isolated. As illustrated in FIG. 2, a p+ guard ring 8 is formed in a p− substrate 1. The guard ring 8 is grounded at node 9. Therefore, a low resistivity path for the substrate noise is created. The noise generated by circuits 2 and/or 3 is more likely to take the low resistivity path to guard ring 8 than to another circuit region, which path has a higher resistivity.

Similar to the structure shown in FIG. 2, conductive deep trenches have also been used. These are more effective at isolating substrate noises than guard rings and shallow trenches. However, the effectiveness of deep trenches is related to their depth, thus their effectiveness is limited. New methods are therefore needed.

SUMMARY OF THE INVENTION

In accordance with one aspect of the present invention, an isolation structure for electromagnetic interference includes a semiconductor substrate, a first integrated circuit in the semiconductor substrate, a second integrated circuit in the semiconductor substrate, and an isolation structure in a direct path between the first and the second integrated circuits, wherein the isolation structure comprises a through-silicon via.

In accordance with another aspect of the present invention, an isolation structure for electromagnetic interference includes a semiconductor substrate, a first circuit region in the semiconductor substrate, a second circuit region in the semiconductor substrate, and an isolation structure extending from a top surface of the semiconductor substrate to a bottom surface of the semiconductor substrate, wherein the isolation structure comprises at least a portion separating the first circuit region and the second circuit region, and wherein the isolation structure is substantially longer than the first and the second circuit regions.

In accordance with yet another aspect of the present invention, an isolation structure for electromagnetic interference includes a semiconductor substrate, a circuit region in the semiconductor substrate, and an isolation structure enclosing the circuit region. The isolation structure includes at least one through-silicon via extending from a top surface of the semiconductor substrate to a bottom surface of the semiconductor substrate, a backside plate on a bottom surface of the semiconductor substrate, wherein the backside plate is electrically connected to the at least one through-silicon via, and a metal cap in a metallization layer and over the circuit region, wherein the metal cap is electrically connected to the at least one through-silicon via.

Since through-silicon vias extend all the way from the top surface of the substrate to the bottom surface of the substrate, better electromagnetic isolation is achieved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
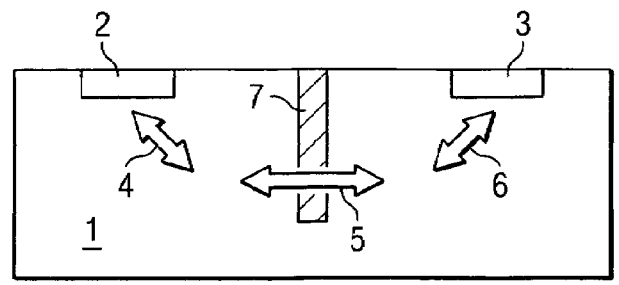
FIG. 1 illustrates a noise path in a substrate between two circuit regions.
Figure 2:
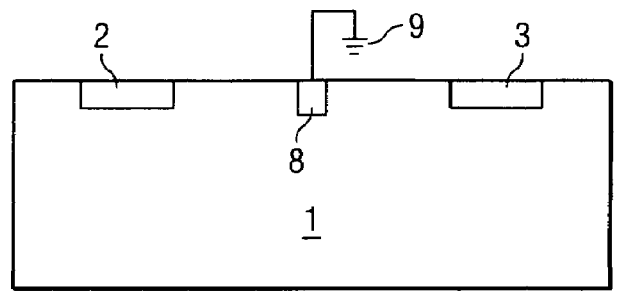
FIG. 2 illustrates a conventional method to isolate noise between circuit regions, wherein a guard ring is formed in a substrate.
Figure 3A:
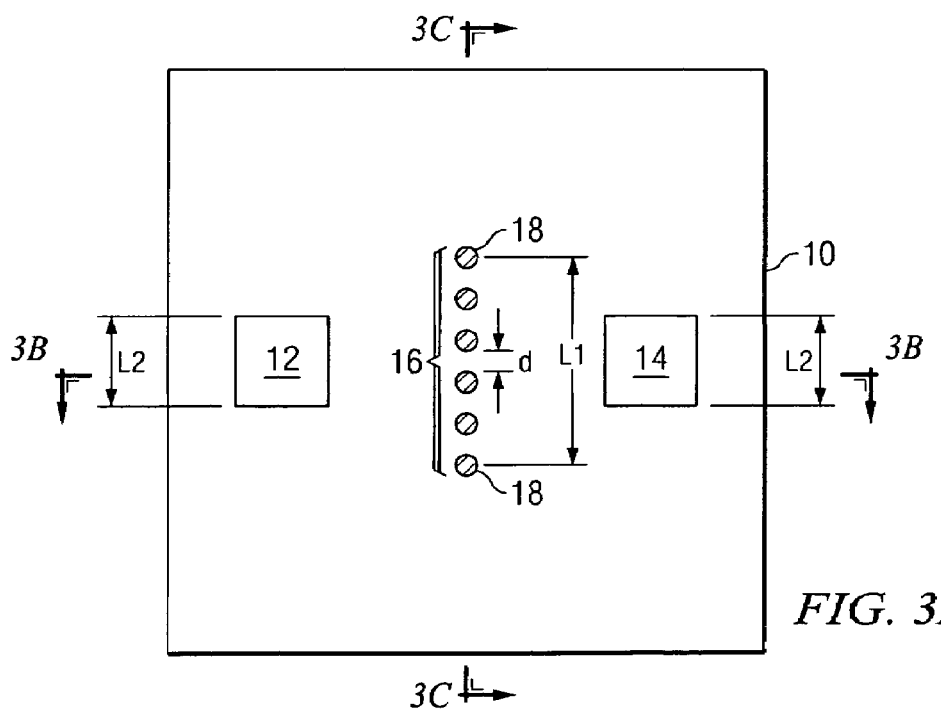
FIG. 3A illustrates a top view of a first embodiment of the present invention, wherein a plurality of through-silicon vias are included in an isolation structure.

FIG. 3A illustrates a top view of a first embodiment of the present invention. A semiconductor substrate 10 includes a first circuit region 12 and a second circuit region 14, wherein at least one of the circuit regions 12 and 14 includes devices that are sensitive to electromagnetic (EM) noise. Regions 12 and 14 are thus preferably isolated from each other. In the preferred embodiment, one of the circuit regions 12 and 14 is an analog region, while the other is a digital region. Alternatively, circuit regions 12 and 14 are either both analog regions, both digital regions, or compound regions that include both analog and digital circuits.

An EM isolation structure 16 is formed in substrate 10 in a direct path between circuit regions 12 and 14. In the preferred embodiment, EM isolation structure 16 comprises at least one through-silicon via 18, also sometimes referred to as a through-wafer via or a through-substrate via in the art. Through-silicon vias are vias that extend from the top surface of the semiconductor substrate to its bottom surface. Preferably, the length L1 of EM isolation structure 16 is greater than the longer length L2 of the circuit regions 12 and 14, and more preferably greater than about 2 times the length L2, wherein lengths L1 and L2 are measured in a direction perpendicular to a line interconnecting circuit regions 12 and 14.

EM isolation structure 16 may include a plurality of through-silicon vias 18, as is shown in FIG. 3A. Preferably, through-silicon vias 18 comprise metallic materials, such as tungsten, aluminum, copper, titanium, tantalum, and combinations thereof. Distance d between through-silicon vias 18 is preferably small, particularly for isolating high-frequency circuits. Thus, the higher the frequency, the smaller the distance d that is preferred. In the preferred embodiment, distance d is less than about 5 μm. More preferably, distance d is equal to the minimum dimension allowed by the technology used for forming the integrated circuits.

Figure 3B:
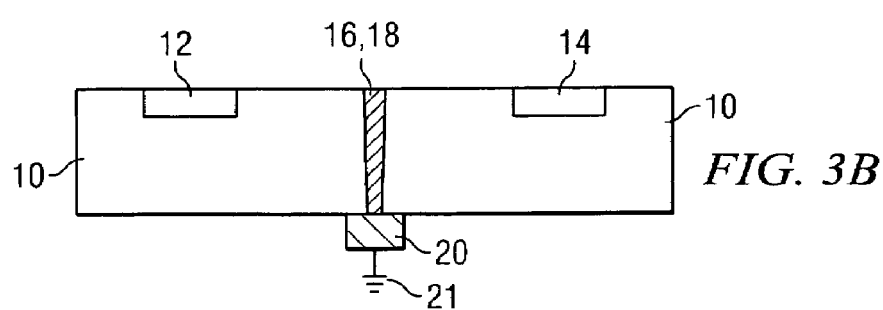
FIGS. 3B and 3C are cross-sectional views of the first embodiment.

FIG. 3B illustrates a cross-sectional view of the structure shown in FIG. 3A, wherein the cross-sectional view is taken along a line 3B-3B in FIG. 3A. It is noted that EM isolation structure 16 extends all the way down substrate 10. Compared to conventional isolation structures that only extend into a portion of the substrates, through-silicon vias provide a better isolation.

Figure 3C:
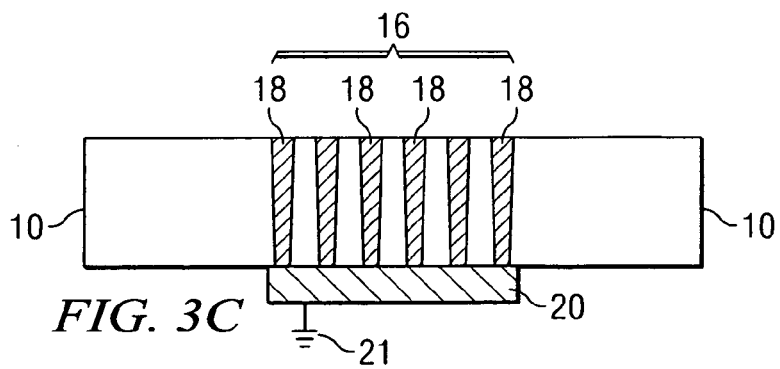

FIG. 3C illustrates another cross-sectional view of the structure shown in FIG. 3A, wherein the cross-sectional view is taken along a line 3C-3C in FIG. 3A. In the preferred embodiment, a backside conductive layer 20 is formed to interconnect through-silicon vias 18. Backside conductive layer 20 is preferably further connected to a node 21, which is either grounded or connected to a voltage source. Backside conductive layer 20 may be formed of similar or different materials as through-silicon vias 18, which may include tungsten, aluminum, copper, titanium, tantalum, and combinations thereof. In the preferred embodiment, backside conductive layer 20 includes metal lines connecting the through-silicon vias 18. In other embodiments, backside conductive layer 20 includes a plate, which preferably extends under at least one of the circuit regions 12 and 14. In yet other embodiments, backside conductive layer 20 covers substantially the entire backside of substrate 10.

Figure 3D:
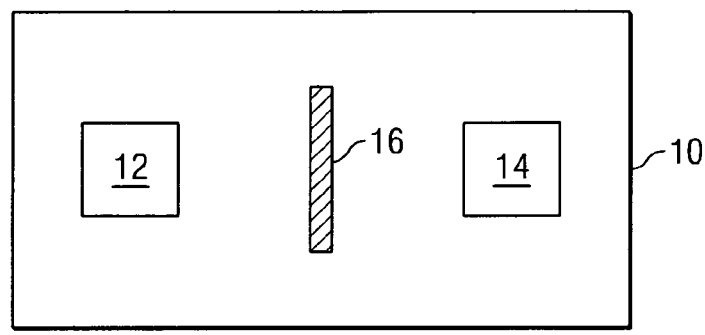
FIGS. 3D and 3E are variations of the first embodiment.
Figure 3E:
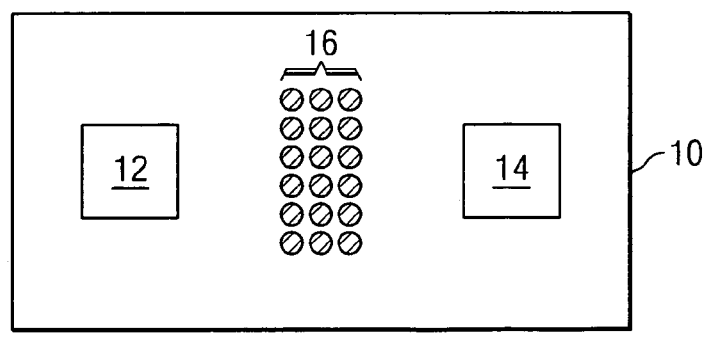

EM isolation structure 16 may have different forms, as is shown in FIGS. 3D and 3E. In FIG. 3D, EM isolation structure 16 comprises a single through-silicon via 18 in the form of a metal strip. In FIG. 3E, EM isolation structure 16 includes an array of through-silicon vias. Each of the through-silicon vias may have the shape of a rectangle, circle, ellipse, cross, triangle, or any other shapes convenient to make.

Figure 4A:
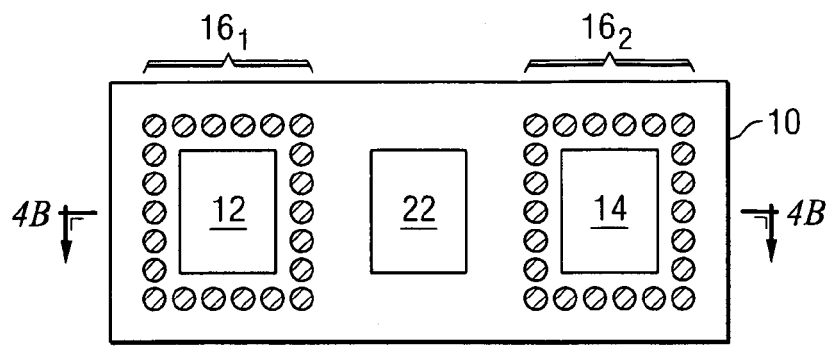
FIG. 4A illustrates a top view of a second embodiment of the present invention, wherein a plurality of through-silicon vias are formed to encircle circuit regions.

FIGS. 4A through 4D illustrate a second embodiment. Referring to FIG. 4A, EM isolation structure 16 includes an EM isolation structure $16_1$ encircling circuit region 12. To achieve better results, another EM isolation structure $16_2$ may be formed to encircle circuit region 14. Furthermore, a circuit region 22 may be formed. Circuit region 22 is not encircled by any EM isolation structure. However, since the EM noise generated by circuit regions 12 and 14 is isolated by the respective isolation structures $16_1$ and $16_2$, circuit regions 12, 14 and 22 are still substantially protected from EM interference with each other.

Figure 4B:
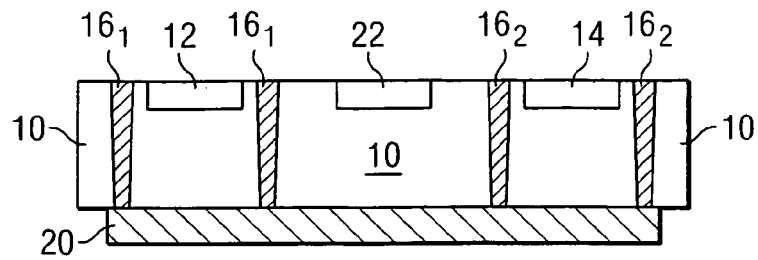
FIG. 4B is a cross-sectional view of the second embodiment, wherein a backside conductive layer is formed.

FIG. 4B illustrates a cross-sectional view of the structure shown in FIG. 4A, wherein the cross-sectional view is taken along a line 4B-4B. Preferably, backside conductive layer 20 is formed and electrically connected to through-silicon vias 18 in isolation structures $16_1$ and $16_2$. Therefore, the EM interference from the sides and the bottom of circuit regions 12 and 14 are significantly reduced.

Figure 4C:
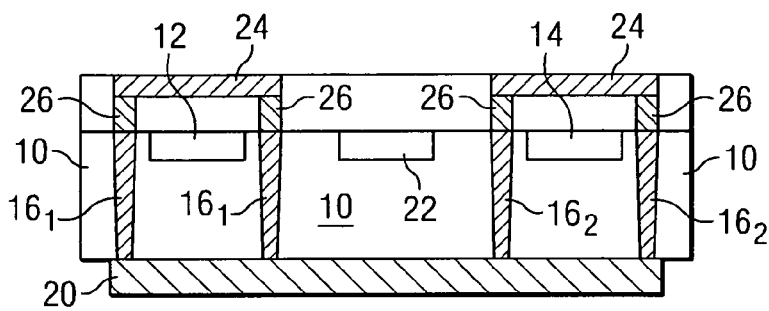
FIG. 4C is a cross-sectional view of the second embodiment, wherein circuit regions are enclosed in cages formed of conductive materials.

FIG. 4C illustrates a cage structure wherein additional metal caps 24 are formed in one of the metallization layers. Metal caps 24 may be formed in the form of metal plates, interconnected parallel metal lines, or metal grids. Metal caps 24 are preferably connected to respective EM isolation structures $16_1$ and $16_2$ through contact plugs 26. Metal caps 24 are preferably formed in metallization layer one, which is the lowest metallization layer. However, metal caps 24 may also be formed in a higher metallization layer, and are preferably connected to through-silicon vias 18 through vias in the metallization layer. The cage structures further isolate circuit regions 12 and 14 from EM interference with circuits over substrate 10. This structure is particularly useful for three-dimensional integrated circuits wherein more than one chip is bonded or stacked. With very short distances, the EM interference between chips is typically high, and thus the cage structure can effectively reduce the vertical EM interference.

Figure 4D:
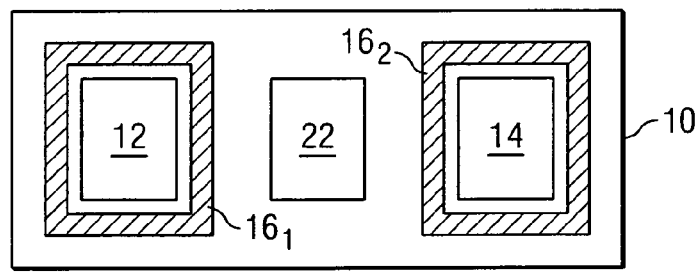
FIG. 4D is a variation of the second embodiment, wherein circuit regions are enclosed in isolation structures.

FIG. 4D illustrates a variation of the isolation structure shown in FIG. 4A. In FIG. 4D, EM isolation structure $16_1$ includes a solid through-silicon via formed as a ring and encircling circuit region 12. Each of the other circuit regions, such as circuit region 14, may also be encircled by isolation structures encircling the respective circuit regions. Each of the isolation structures may either include a plurality of through-silicon vias or a solid through-silicon via.

Figure 5A:
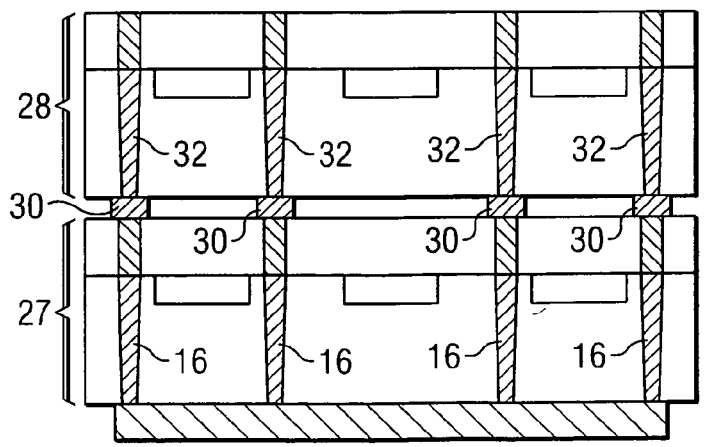
FIGS. 5A and 5B illustrate stacked dies wherein through-silicon vias in two dies are interconnected.

FIG. 5A illustrates stacked dies (also referred to as a three-dimensional integrated circuit or 3DIC), wherein a die 28 is stacked on a die 27. The isolation structures 16 in die 27 are connected to bonding pads 30, which are further connected to through-silicon vias 32 in die 28, wherein the electrical connection may be performed through metal-to-metal bonding or through solder bumps.

Figure 5B:
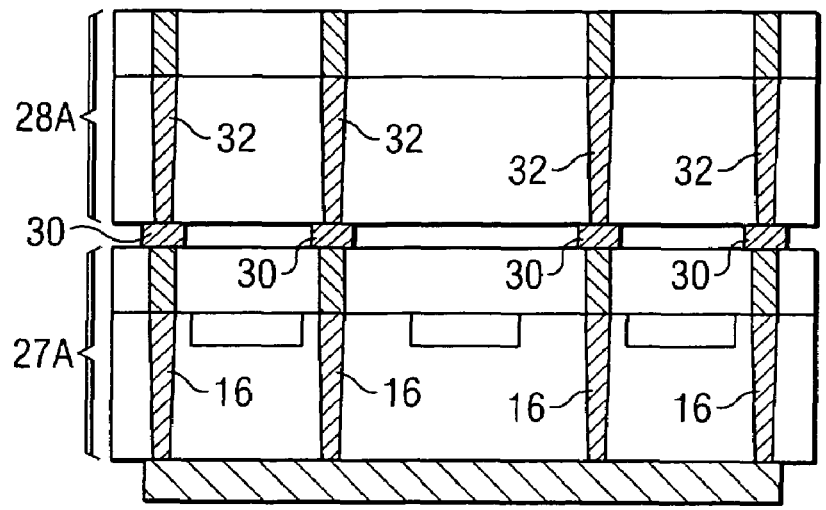

FIG. 5B illustrates a variation of the stacked dies in FIG. 5A, wherein an interposer 28A, having no active circuits and devices, is stacked onto a second die 27A, which has active circuits and devices formed therein. Interposer 28A can function to interface die 27A to another circuit or a package substrate, electrically and mechanically, as is commonly done in the art. It may have substantially the same type of isolation structures as formed from the through-silicon vias, but lacks active devices.

Figure 6:
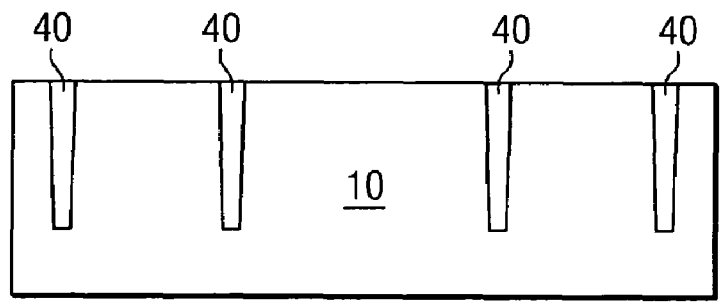
FIGS. 6 through 9 are cross-sectional views of intermediate stages in the manufacture of a preferred embodiment.

FIGS. 6 through 9 illustrate an exemplary embodiment for forming through-silicon vias. It should be realized, however, that through-silicon vias may be formed using various methods other than the illustrated example. Referring to FIG. 6, a semiconductor substrate 10 is provided. Deep dielectric plugs 40 are then formed. The formation of deep dielectric plugs 40 includes plasma etching to form openings, wherein a mask layer such as a photoresist is formed and patterned and a plasma etching is performed to form openings in substrate 10. The openings are then filled with dielectric materials, resulting in deep dielectric plugs 40. Alternatively, the openings may be formed by laser drilling. Deep dielectric plugs 40 preferably have a depth greater than about 30 µm.

Figure 7:
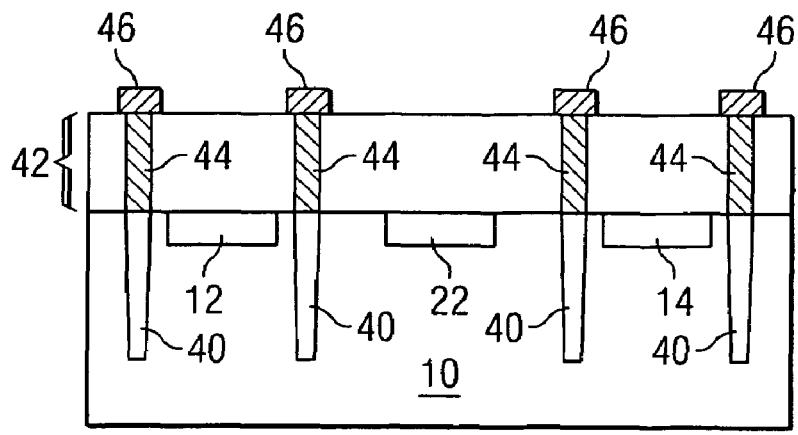

Referring to FIG. 7, integrated circuits are formed in circuit regions 12 and 14, which are separated by deep dielectric plugs 40. An interconnect structure 42 is then formed, which includes metallization layers formed in dielectric layers. FIG. 7 schematically illustrates conductive features 44 that symbolize vias and metallization layers. Interconnect structure 42 interconnects deep dielectric plugs 40 to bonding pads 46, which are located on top of the wafer. The formation processes for interconnect structure 42 and bonding pads 46 are well-known in the art, thus are not repeated herein.

Figure 8:
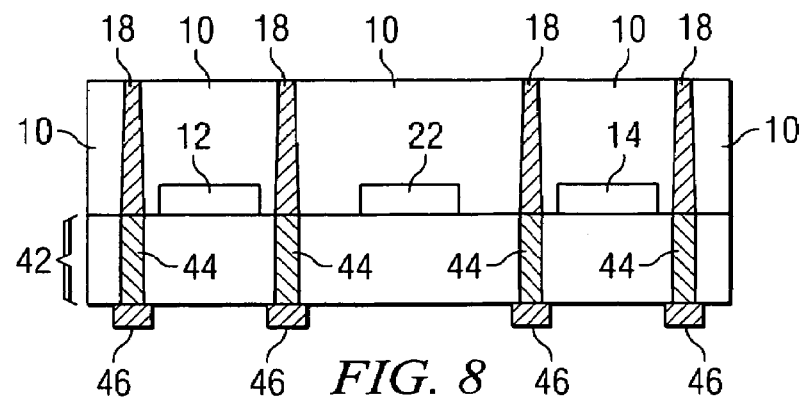

In FIG. 8 (an upside down view of the previously formed structure), the above-discussed structure is polished from the bottom side of substrate 10, and thus deep dielectric plugs 40 are exposed. Deep dielectric plugs 40 are then selectively removed from semiconductor substrate 10, preferably by etching. The openings left by the deep dielectric plugs 40 are filled with conductive materials, which preferably include tungsten, aluminum, copper, titanium, tantalum, and combinations thereof. The resulting features in the openings are through-silicon vias 18.

Figure 9:
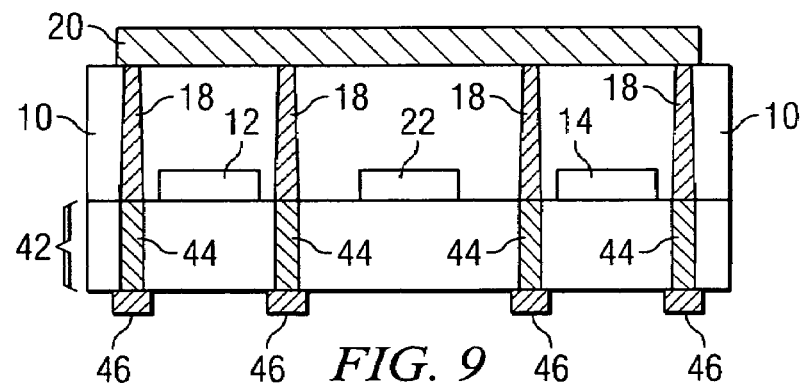

FIG. 9 illustrates the formation of a backside conductive layer 20. In the preferred embodiment, backside conductive layer 20 is blanket sputtered to a desired thickness of, for example, about 200 µm to about 1000 µm, and more preferably about 200 µm to about 400 µm. In other embodiments, physical vapor deposition (PVD), plating, and plasma enhanced CVD (PECVD) can be used. Backside conductive layer 20 may be further patterned to form plates, metal lines, or metal line grids. The backside conductive layer 20 is preferably grounded or connected to a voltage source.

Figure 10:
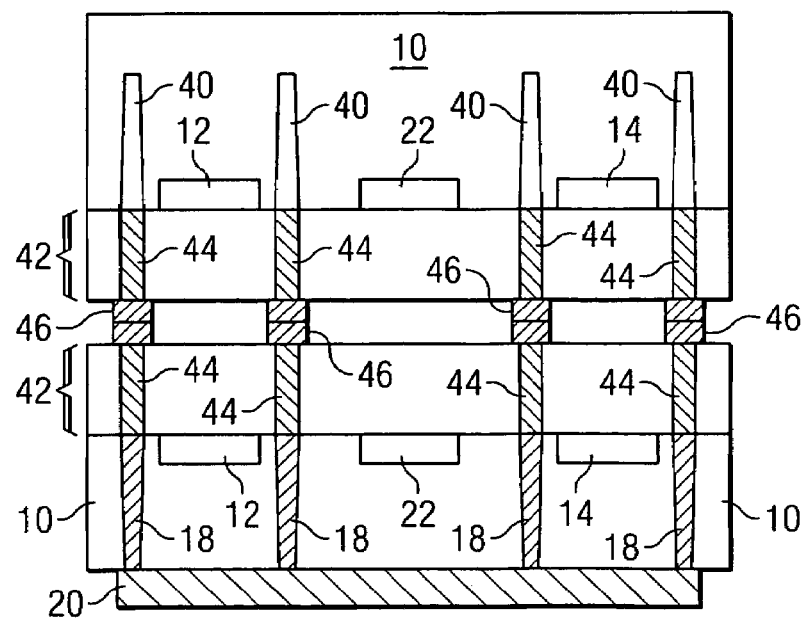
FIG. 10 is a cross-sectional view of an intermediate stage in the manufacture of stacked dies.

Stacked dies may be formed using the processes discussed in the preceding paragraphs. In an exemplary process, a first die is processed until a structure as shown in FIG. 7 is formed, and a second die is processed until a structure as shown in FIG. 9 is formed. The first and the second dies are then stacked with the bonding pads 46 on one die connected to the bonding pads 46 on the other die, resulting in a structure similar to what is shown in FIG. 10. Preferably, bonding pads 46 on the first die and the second die are bonded using metal-to-metal bonding. However, solder bumps can also be used. Semiconductor substrate 10 is then thinned, and the deep contact plugs 40 are replaced with through-silicon vias 18.

The preferred embodiments of the present invention have several advantageous features. Since through-silicon vias extend from the top surface of the semiconductor substrate to the bottom surface, EM noise isolation is significantly more effective than with isolation structures that only extend into a portion of the substrate. Furthermore, a conductive layer can be easily formed on the backside of the substrate and connected to the isolation structure in the substrate, further improving the isolation ability. The preferred embodiments of the present invention are useful for integrated circuits highly sensitive to electromagnetic interferences, such as 3DIC packages, and, particularly, chips that have integrated analog and digital circuits. Besides the stacked dies and 3DIC circuits comprising vertically located circuits, chips that are located in a coplanar manner, for example, a system in package (SIP), also benefits from the preferred isolation structure.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
   a semiconductor substrate;
   a first integrated circuit in the semiconductor substrate;
   a second integrated circuit in the semiconductor substrate;
   an isolation structure in a direct path between the first and the second integrated circuits, wherein the isolation structure comprises a through-silicon via; and
   a backside conductive layer on a backside of the semiconductor substrate and electrically connected to the isolation structure.

2. The integrated circuit structure of claim 1, wherein the isolation structure comprises a row of through-silicon vias.

3. The integrated circuit structure of claim 1, wherein the isolation structure comprises one solid through-silicon via in a form of a metal strip.

4. The integrated circuit structure of claim 1, wherein the isolation structure encircles the first integrated circuit.

5. The integrated circuit structure of claim 4 further comprising an additional isolation structure encircling the second integrated circuit.

6. The integrated circuit structure of claim 1 further comprising a metal cap over the first circuit region and in a metallization layer, wherein the metal cap is electrically connected to the isolation structure.

7. The integrated circuit structure of claim 1, wherein the isolation structure is grounded.

8. The integrated circuit structure of claim 1, wherein the isolation structure has a length greater than about 2 times lengths of the first and the second integrated circuits.

9. An integrated circuit structure comprising:
   a semiconductor substrate;
   a first circuit region in the semiconductor substrate;
   a second circuit region in the semiconductor substrate;
   an isolation structure extending from a top surface of the semiconductor substrate to a bottom surface of the semiconductor substrate, wherein the isolation structure comprises at least a portion separating the first circuit region and the second circuit region, and wherein the isolation structure is substantially longer than each of the first and the second circuit regions; and
   a metal cap in a metallization layer and over the first circuit region, wherein the metal cap is electrically connected to the isolation structure.

10. The integrated circuit structure of claim 9, wherein the isolation structure encircles the first circuit region.

11. The integrated circuit structure of claim 10 further comprising a backside plate on a backside of the semiconductor substrate, wherein the backside plate is electrically connected to the isolation structure, and wherein the isolation structure, the metal cap and the backside plate form a cage enclosing the first circuit region.

12. The integrated circuit structure of claim 9, wherein the isolation structure comprises a row of through-silicon vias interconnected by a backside conductive layer.

13. The integrated circuit structure of claim 9 further comprising an additional semiconductor substrate stacked on the semiconductor substrate, wherein the additional semiconductor substrate comprises an additional isolation structure electrically connected to the isolation structure.

14. An integrated circuit structure comprising:
   a semiconductor substrate;
   a circuit region in the semiconductor substrate; and
   an isolation structure enclosing the circuit region, wherein the isolation structure comprises:
      at least one through-silicon via extending from a top surface of the semiconductor substrate to a bottom surface of the semiconductor substrate;
      a backside plate on a bottom surface of the semiconductor substrate, wherein the backside plate is electrically connected to the at least one through-silicon via; and
      a metal cap in a metallization layer and over the circuit region, wherein the metal cap is electrically connected to the at least one through-silicon via.

15. The integrated circuit structure of claim 14, wherein the isolation structure is grounded.

16. The integrated circuit structure of claim 14, wherein the isolation structure comprises a plurality of through-silicon vias.

17. The integrated circuit structure of claim 14, wherein the isolation structure comprises one solid through-silicon via forming a ring.

18. The integrated circuit structure of claim 14, wherein the metal cap is in a form selected from the group consisting essentially of a solid plate, parallel interconnected metal lines, and a metal line grid.

* * * * *